(12) United States Patent
Vos et al.

(10) Patent No.: US 9,491,539 B2
(45) Date of Patent: Nov. 8, 2016

(54) MEMS APPARATUS DISPOSED ON ASSEMBLY LID

(71) Applicant: Knowles Electronics, LLC, Itasca, IL (US)

(72) Inventors: Sandra F. Vos, East Dundee, IL (US); John B. Szczech, Schaumburg, IL (US)

(73) Assignee: Knowles Electronics, LLC, Itasca, IL (US)

( * ) Notice: Subject to any disclaimer, the term of this patent is extended or adjusted under 35 U.S.C. 154(b) by 15 days.

(21) Appl. No.: 13/953,175

(22) Filed: Jul. 29, 2013

(65) Prior Publication Data

US 2014/0037115 A1    Feb. 6, 2014

Related U.S. Application Data

(60) Provisional application No. 61/678,175, filed on Aug. 1, 2012.

(51) Int. Cl.
| | | |
|---|---|---|
| *H04R 25/00* | (2006.01) | |
| *H04R 3/00* | (2006.01) | |
| *H04R 19/00* | (2006.01) | |
| *H04R 19/04* | (2006.01) | |
| *H04R 31/00* | (2006.01) | |
| *H01L 29/84* | (2006.01) | |

(52) U.S. Cl.
CPC .............. *H04R 3/00* (2013.01); *H04R 19/005* (2013.01); *H04R 19/04* (2013.01); *H04R 31/00* (2013.01); *H01L 2224/48137* (2013.01); *H01L 2224/49171* (2013.01)

(58) Field of Classification Search
USPC ....... 381/174, 150, 355, 333, 306, 388, 334, 381/361, 365, 175, 374; 29/594, 609.1; 257/416, 704, 723, 724, 731, 774, 782
See application file for complete search history.

(56) References Cited

U.S. PATENT DOCUMENTS

| | | |
|---|---|---|
| 5,490,220 A | 2/1996 | Loeppert |
| 5,740,261 A | 4/1998 | Loeppert |

(Continued)

FOREIGN PATENT DOCUMENTS

| | | |
|---|---|---|
| CN | 1933681 | 3/2007 |
| CN | 201536417 | 7/2010 |

(Continued)

OTHER PUBLICATIONS

International Search Report for PCT/US2013/052359, mailed Oct. 22, 2013, 9 pages.

(Continued)

*Primary Examiner* — Sunita Joshi
(74) *Attorney, Agent, or Firm* — Foley & Lardner LLP

(57) ABSTRACT

A Microelectromechanical system (MEMS) assembly includes a substrate, lid, MEMS device, and at least one wall. The substrate has electrical connection pads and the electrical connection pads are coupled to electrical conductors extending through the substrate. The MEMS device is attached to the lid. The at least one wall is coupled to the lid and the substrate and is formed separately from the lid and has an electrical conduit disposed therein. The electrical conduit is electrically coupled to the electrical conductors on the substrate. The electrical conduit and electrical conductors form an electrical path between the MEMS device and the electrical connection pads.

17 Claims, 18 Drawing Sheets

(56) References Cited

U.S. PATENT DOCUMENTS

| | | |
|---|---|---|
| 5,870,482 A | 2/1999 | Loeppert |
| 6,535,460 B2 | 3/2003 | Loeppert |
| 6,552,469 B1 | 4/2003 | Pederson |
| 6,781,231 B2 | 8/2004 | Minervini |
| 6,847,090 B2 | 1/2005 | Loeppert |
| 6,987,859 B2 | 1/2006 | Loeppert |
| 7,023,066 B2 | 4/2006 | Lee |
| 7,132,307 B2 | 11/2006 | Wang |
| 7,166,910 B2 | 1/2007 | Minervini |
| 7,190,038 B2 | 3/2007 | Dehe et al. |
| 7,242,089 B2 | 7/2007 | Minervini |
| 7,297,567 B2 | 11/2007 | Loeppert |
| 7,381,589 B2 | 6/2008 | Minervini |
| 7,382,048 B2 | 6/2008 | Minervini |
| 7,434,305 B2 | 10/2008 | Minervini |
| 7,439,616 B2 | 10/2008 | Minervini |
| 7,473,572 B2 | 1/2009 | Dehe et al. |
| 7,501,703 B2 | 3/2009 | Minervini |
| 7,537,964 B2 | 5/2009 | Minervini |
| 7,633,156 B2 | 12/2009 | Minervini |
| 7,781,249 B2 | 8/2010 | Laming et al. |
| 7,795,695 B2 | 9/2010 | Weigold et al. |
| 7,825,484 B2 | 11/2010 | Martin et al. |
| 7,829,961 B2 | 11/2010 | Hsiao |
| 7,856,804 B2 | 12/2010 | Laming et al. |
| 7,903,831 B2 | 3/2011 | Song |
| 8,018,049 B2 | 9/2011 | Minervini |
| 8,121,331 B2 | 2/2012 | Minervini |
| 8,170,244 B2 | 5/2012 | Ryan |
| 8,358,004 B2 | 1/2013 | Minervini |
| 8,450,817 B2 | 5/2013 | Minervini |
| 8,457,332 B2 | 6/2013 | Loeppert |
| 8,526,665 B2 | 9/2013 | Lutz |
| 8,594,347 B2 | 11/2013 | Ryan |
| 8,617,934 B1 | 12/2013 | Minervini |
| 8,623,709 B1 | 1/2014 | Minervini |
| 8,623,710 B1 | 1/2014 | Minervini |
| 8,624,384 B1 | 1/2014 | Minervini |
| 8,624,385 B1 | 1/2014 | Minervini |
| 8,624,386 B1 | 1/2014 | Minervini |
| 8,624,387 B1 | 1/2014 | Minervini |
| 8,629,005 B1 | 1/2014 | Minervini |
| 8,629,551 B1 | 1/2014 | Minervini |
| 8,629,552 B1 | 1/2014 | Minervini |
| 8,633,064 B1 | 1/2014 | Minervini |
| 8,652,883 B1 | 2/2014 | Minervini |
| 8,704,360 B1 | 4/2014 | Minervini |
| 8,765,530 B1 | 7/2014 | Minervini |
| 8,781,140 B2 | 7/2014 | Lautenschlager |
| 8,791,531 B2 | 7/2014 | Loeppert |
| 8,879,767 B2 | 11/2014 | Wickstrom |
| 8,969,980 B2 | 3/2015 | Lee |
| 8,987,030 B2 | 3/2015 | Loeppert |
| 8,995,694 B2 | 3/2015 | Vos |
| 9,006,880 B1 | 4/2015 | Minervini |
| 9,023,689 B1 | 5/2015 | Minervini |
| 9,024,432 B1 | 5/2015 | Minervini |
| 9,040,360 B1 | 5/2015 | Minervini |
| 9,051,171 B1 | 6/2015 | Minervini |
| 9,061,893 B1 | 6/2015 | Minervini |
| 9,067,780 B1 | 6/2015 | Minervini |
| 9,078,063 B2 | 7/2015 | Loeppert |
| 9,096,423 B1 | 8/2015 | Minervini |
| 9,107,008 B2 | 8/2015 | Leitner |
| 9,133,020 B1 | 9/2015 | Minervini |
| 9,137,595 B2 | 9/2015 | Lee |
| 9,139,421 B1 | 9/2015 | Minervini |
| 9,139,422 B1 | 9/2015 | Minervini |
| 9,148,731 B1 | 9/2015 | Minervini |
| 9,150,409 B1 | 10/2015 | Minervini |
| 2002/0020898 A1* | 2/2002 | Vu ................ H01L 21/56 257/676 |
| 2004/0253760 A1 | 12/2004 | Zhang |
| 2005/0207605 A1 | 9/2005 | Dehe et al. |
| 2006/0290002 A1* | 12/2006 | Arana .............. H01L 21/76898 257/774 |
| 2007/0058826 A1* | 3/2007 | Sawamoto .......... H04R 19/04 381/174 |
| 2007/0201709 A1 | 8/2007 | Suzuki |
| 2007/0215962 A1 | 9/2007 | Minervini |
| 2007/0278501 A1 | 12/2007 | MacPherson et al. |
| 2008/0142475 A1 | 6/2008 | Loeppert |
| 2008/0175425 A1 | 7/2008 | Roberts et al. |
| 2008/0217709 A1 | 9/2008 | Minervini |
| 2008/0267431 A1 | 10/2008 | Leidl et al. |
| 2008/0279407 A1 | 11/2008 | Pahl |
| 2008/0283942 A1 | 11/2008 | Huang et al. |
| 2009/0001553 A1 | 1/2009 | Pahl et al. |
| 2009/0180655 A1 | 7/2009 | Tien et al. |
| 2010/0046780 A1 | 2/2010 | Song |
| 2010/0052082 A1* | 3/2010 | Lee ................ B81B 7/0061 257/416 |
| 2010/0119088 A1 | 5/2010 | Sheplak et al. |
| 2010/0128914 A1 | 5/2010 | Khenkin |
| 2010/0183174 A1* | 7/2010 | Suvanto et al. ............. 381/174 |
| 2010/0183181 A1 | 7/2010 | Wang |
| 2010/0246877 A1 | 9/2010 | Wang |
| 2010/0290644 A1 | 11/2010 | Wu et al. |
| 2010/0322443 A1 | 12/2010 | Wu et al. |
| 2010/0322451 A1 | 12/2010 | Wu et al. |
| 2011/0013787 A1 | 1/2011 | Chang |
| 2011/0042762 A1 | 2/2011 | Laming |
| 2011/0075875 A1 | 3/2011 | Wu et al. |
| 2011/0158450 A1 | 6/2011 | Tanaka et al. |
| 2011/0215429 A1* | 9/2011 | Yoshida ................ 257/415 |
| 2012/0039499 A1 | 2/2012 | Ryan |
| 2012/0056282 A1 | 3/2012 | VanLippen |
| 2012/0087521 A1* | 4/2012 | Delaus et al. .............. 381/174 |
| 2012/0099753 A1 | 4/2012 | vanderAvoort |
| 2012/0126347 A1 | 5/2012 | Yang et al. |
| 2013/0108074 A1 | 5/2013 | Reining |
| 2013/0177192 A1 | 7/2013 | Abry |
| 2013/0343580 A1 | 12/2013 | Lautenschlager |
| 2014/0037120 A1 | 2/2014 | Lim |
| 2014/0037124 A1 | 2/2014 | Lim |
| 2014/0064546 A1 | 3/2014 | Szczech |
| 2014/0133686 A1 | 5/2014 | Lee |
| 2014/0177113 A1 | 6/2014 | Gueorguiev |
| 2014/0291783 A1 | 10/2014 | Talag |
| 2014/0291784 A1 | 10/2014 | Conklin |
| 2014/0294209 A1 | 10/2014 | Szczech |
| 2014/0321687 A1 | 10/2014 | Friel |
| 2015/0117681 A1 | 4/2015 | Watson |
| 2015/0139428 A1 | 5/2015 | Reining |
| 2015/0166335 A1 | 6/2015 | Loeppert |
| 2015/0172825 A1 | 6/2015 | Lim |
| 2015/0195659 A1 | 7/2015 | Szczech |
| 2015/0208165 A1 | 7/2015 | Volk |
| 2015/0237448 A1 | 8/2015 | Loeppert |
| 2015/0251898 A1 | 9/2015 | Vos |

FOREIGN PATENT DOCUMENTS

| | | |
|---|---|---|
| CN | 102275861 | 12/2011 |
| CN | 102340727 | 2/2012 |
| CN | 102421053 | 4/2012 |
| DE | 102011002460 | 7/2012 |
| JP | 2008-510427 | 4/2008 |
| WO | WO 2006/023016 | 3/2006 |
| WO | 2012088688 A1 | 7/2012 |

OTHER PUBLICATIONS

Extended European Search Report for PCT/US2013/052359 dated Jan. 4, 2016 (8 pages).

* cited by examiner

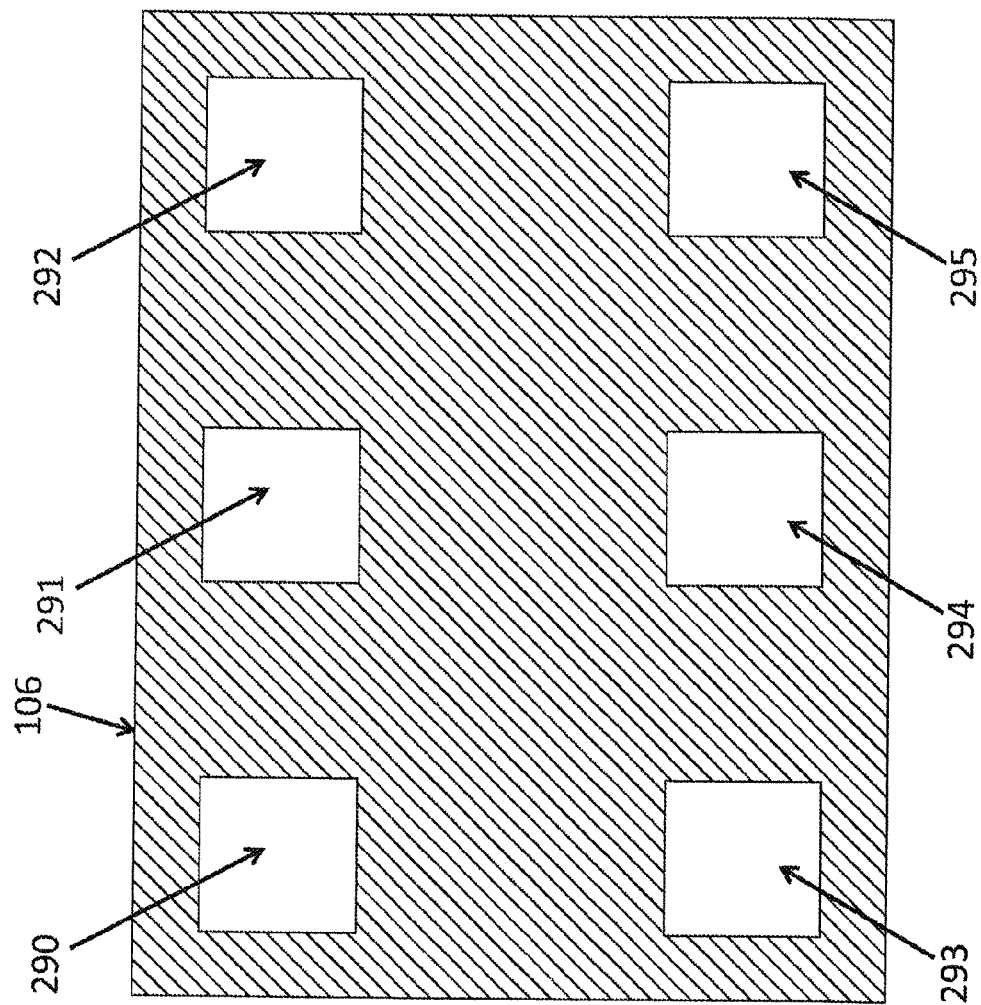

MEMS APPARATUS DISPOSED ON ASSEMBLY LID

CROSS REFERENCE TO RELATED APPLICATION

This patent claims benefit under 35 U.S.C. §119 (e) to U.S. Provisional Application No. 61/678,175 entitled "MEMS Apparatus Disposed on Assembly Lid" filed Aug. 1, 2012, the content of which is incorporated herein by reference in its entirety.

TECHNICAL FIELD

This application relates to electromechanical acoustic assemblies and, more specifically, to the electrical connections associated with these assemblies.

BACKGROUND OF THE INVENTION

Various types of surface mountable microphone package architects have been used through the years. Within these assemblies, different electrical components are housed together forming an assembly. For example, a microphone assembly typically includes a Microelectromechanical system (MEMS) device or transducer, and an integrated circuit (IC). One example of a MEMS device includes a diaphragm and a back plate. The housing of the assembly typically contains a port or opening to allow acoustic energy to enter the microphone assembly. This acoustic energy, in turn, causes the diaphragm in the MEMS device to deflect. As the diaphragm deflects, the electrical potential between the back plate and the diaphragm varies and creates an electrical signal proportional to the acoustic energy acting on the diaphragm. The electrical signal is then routed to an external interface allowing the end user to make a mechanically and electrically robust connection.

The acoustic performance of a microphone assembly is related in part to the ratio of front volume (i.e., the volume of air between the diaphragm and the acoustic port) to back volume (i.e., the volume of the air contained by the package cavity and diaphragm) of the assembly. In typical top port devices, the components are attached directly to the substrate or base and the acoustic port is located on the top or lid, making the front volume large relative to the back volume. This is not the preferred ratio needed for optimum performance (i.e. high sensitivity, flat wideband response) of a microphone assembly.

All of the above-mentioned disadvantages with previous approaches have resulted in general user dissatisfaction with some aspects of these previous approaches.

BRIEF DESCRIPTION OF THE DRAWINGS

For a more complete understanding of the disclosure, reference should be made to the following detailed description and accompanying drawings wherein:

FIG. 18 comprises a bottom view of the base of the microphone assembly of FIG. 10 according to various embodiments of the present invention.

Figure 1:
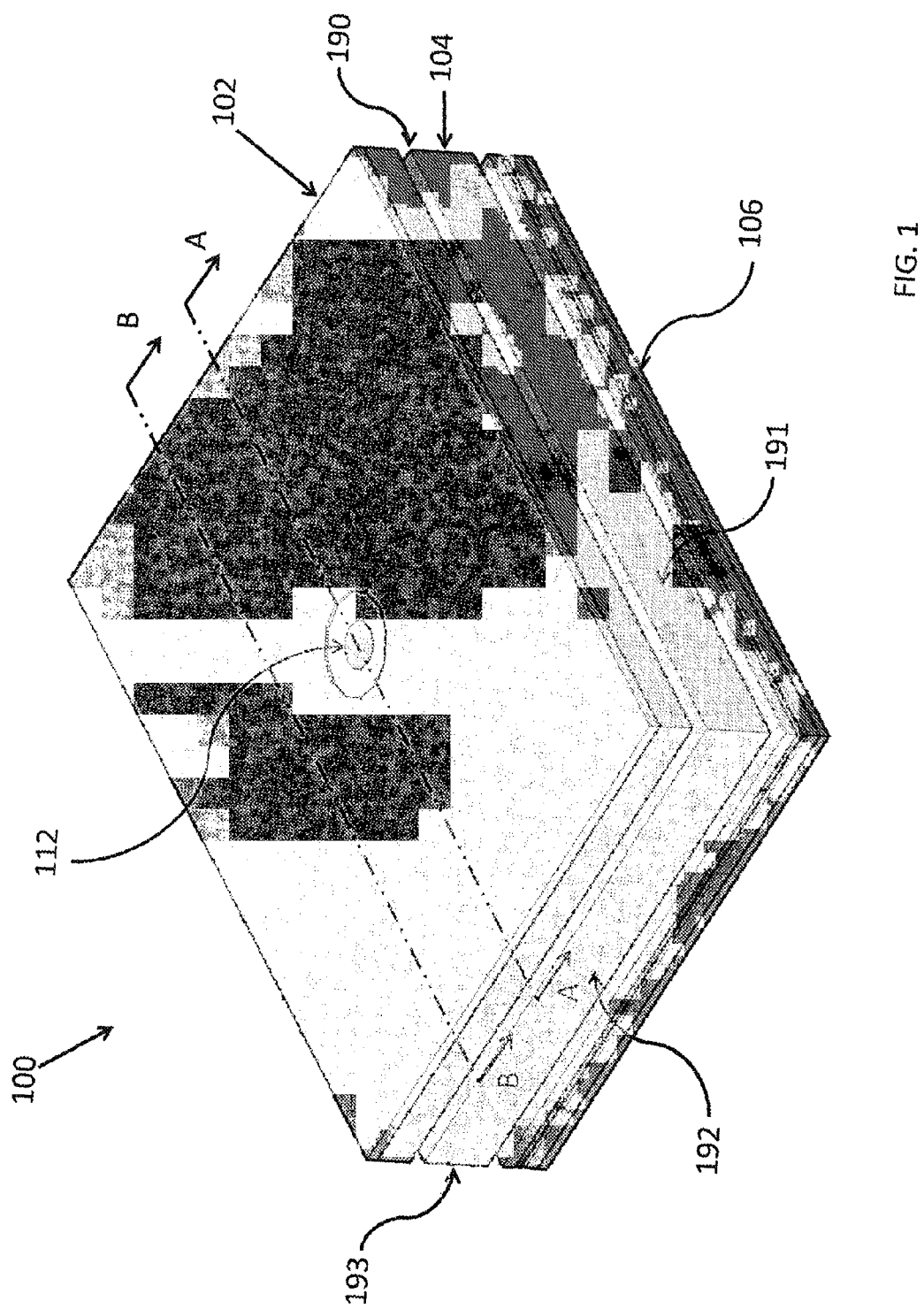
FIG. 1 comprises an isometric view of a microphone assembly according to various embodiments of the present invention.

Skilled artisans will appreciate that elements in the figures are illustrated for simplicity and clarity. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION

Microphone assemblies are provided where MEMS components are disposed at the lid of the assembly. In some aspects, a MEMS device or component is attached to the bottom side of the lid. Electrical connections within the microphone assemblies and between the internal components and customer connection pads are provided at least in part through walls, lid and base of the assembly. In so doing, the MEMS device is preferably mounted close to the acoustic port. The present approaches establish electrical connections such that the MEMS devices can be mounted in a preferred orientation that enhances its electromechanical response to acoustic energy without significant alterations to the external interface location relative to the acoustic port.

In addition, the assemblies described herein are manufacturable since the electrical connections between the integrated circuit (IC) and external interface are established using standard surface mount interconnect and PCB manufacturing techniques. Further, the assemblies provided herein provide microphone assemblies with reduced front volumes and increased back volumes. In general, the decrease in front volume shifts the resonance of the microphone assembly out to higher frequencies while increasing the back volume increases the overall sensitivity of the MEMS device.

In many of these embodiments, an acoustic assembly includes a lid, a wall portion, and a base. The wall portion is coupled to the base, and the lid is coupled to the wall. In some aspects, the lid is generally flat and does not include any intentional electrical contacts. In some aspects, the surface of the lid can be used as a connection to electrical ground for electromagnetic shielding purposes. A MEMS device and an IC are coupled to an interior portion of the lid and are housed in a cavity formed by the wall portion. The MEMS device and the integrated circuit are coupled together, for instance, by a wire or some other electrical connection. The IC is coupled to a conductive portion of the lid by another conductor, such as a second wire. The conductive portion of the lid is coupled to a first conductive via that is formed in and extends though the bulk of the wall. A second conductive via is formed in and extends through the bulk of the base, and is electrically coupled to the first via. The second conductive via is also electrically coupled to a customer contact pad on the exterior of the base thereby providing an electrical connection for a customer. An electrical signal is produced by the MEMS device, processed by the integrated circuit, transmitted through the conductive portion of the lid and then through the first and second vias, and presented at the customer electrical contact pad on the exterior of the base.

In others of these embodiments, a Microelectromechanical system (MEMS) assembly includes a substrate, cover, MEMS device, and at least one wall. The substrate has electrical connection pads and the electrical connection pads are coupled to electrical conductors extending through the substrate. The MEMS device is attached to the cover. At least one wall is coupled to the cover and the substrate and is formed separately from the cover and has an electrical conduit disposed therein. The electrical conduit is electrically coupled to the electrical conductors on the substrate. The electrical conduit and electrical conductors form an electrical path between the MEMS device and the electrical connection pads.

Figure 2:
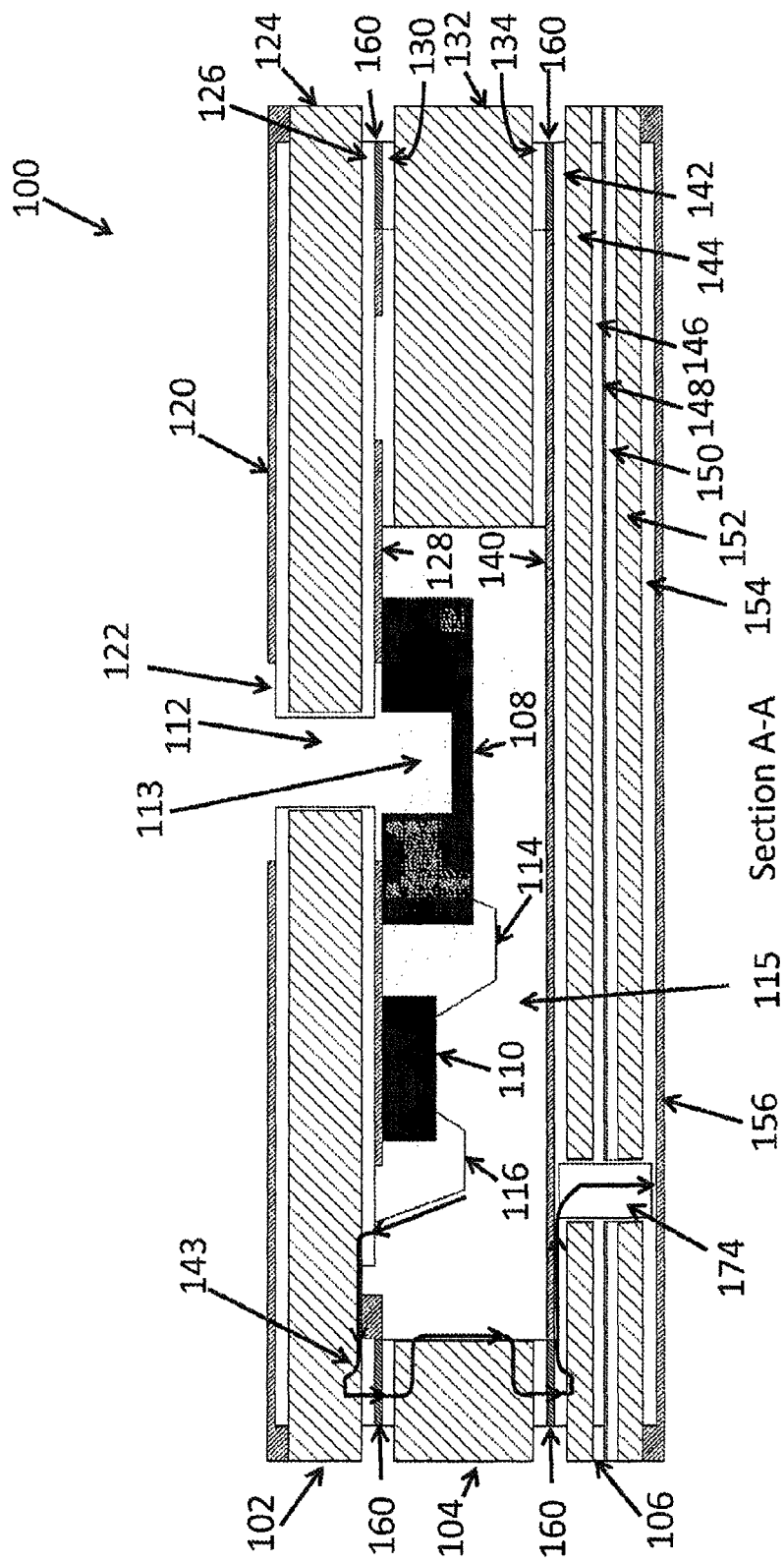
FIG. 2 comprises a cross-sectional view taken along lines A-A of the microphone assembly of FIG. 1 according to various embodiments of the present invention.
Figure 3:
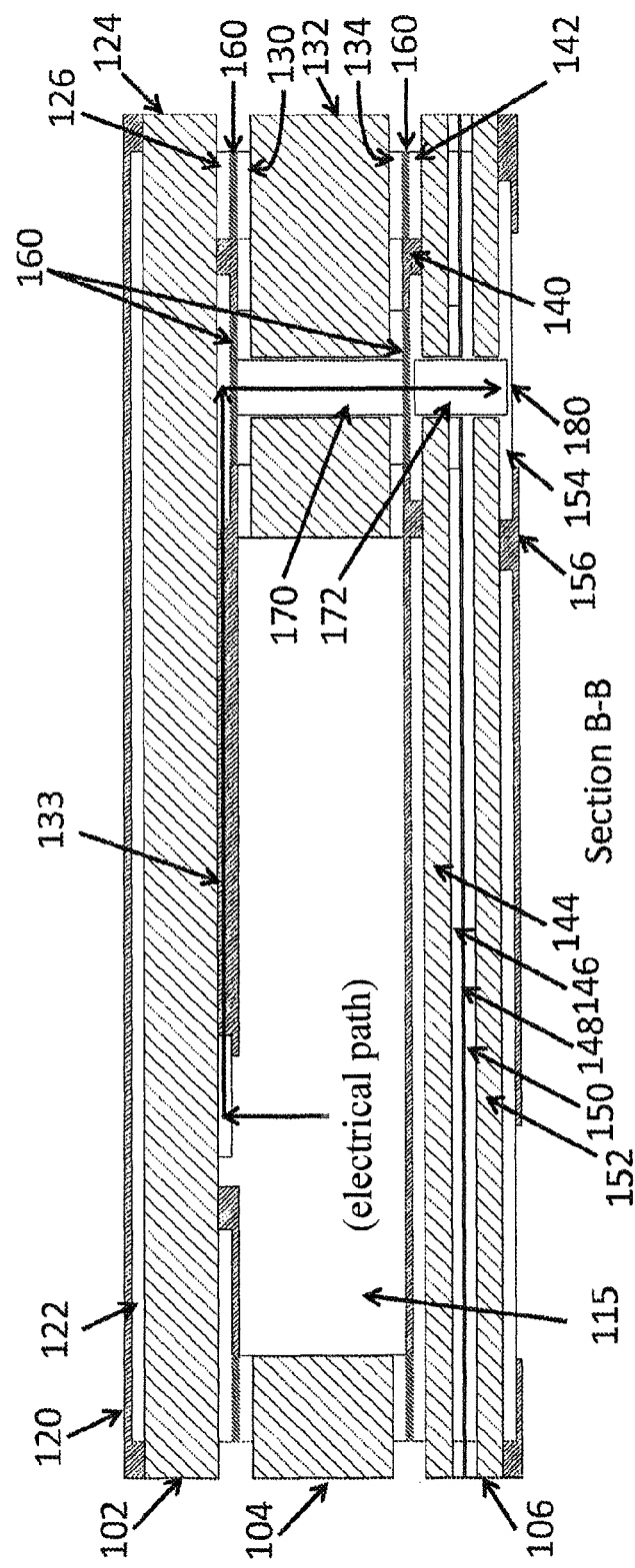
FIG. 3 comprises a cross-sectional view taken along lines B-B of the microphone assembly of FIG. 1 according to various embodiments of the present invention.
Figure 4:
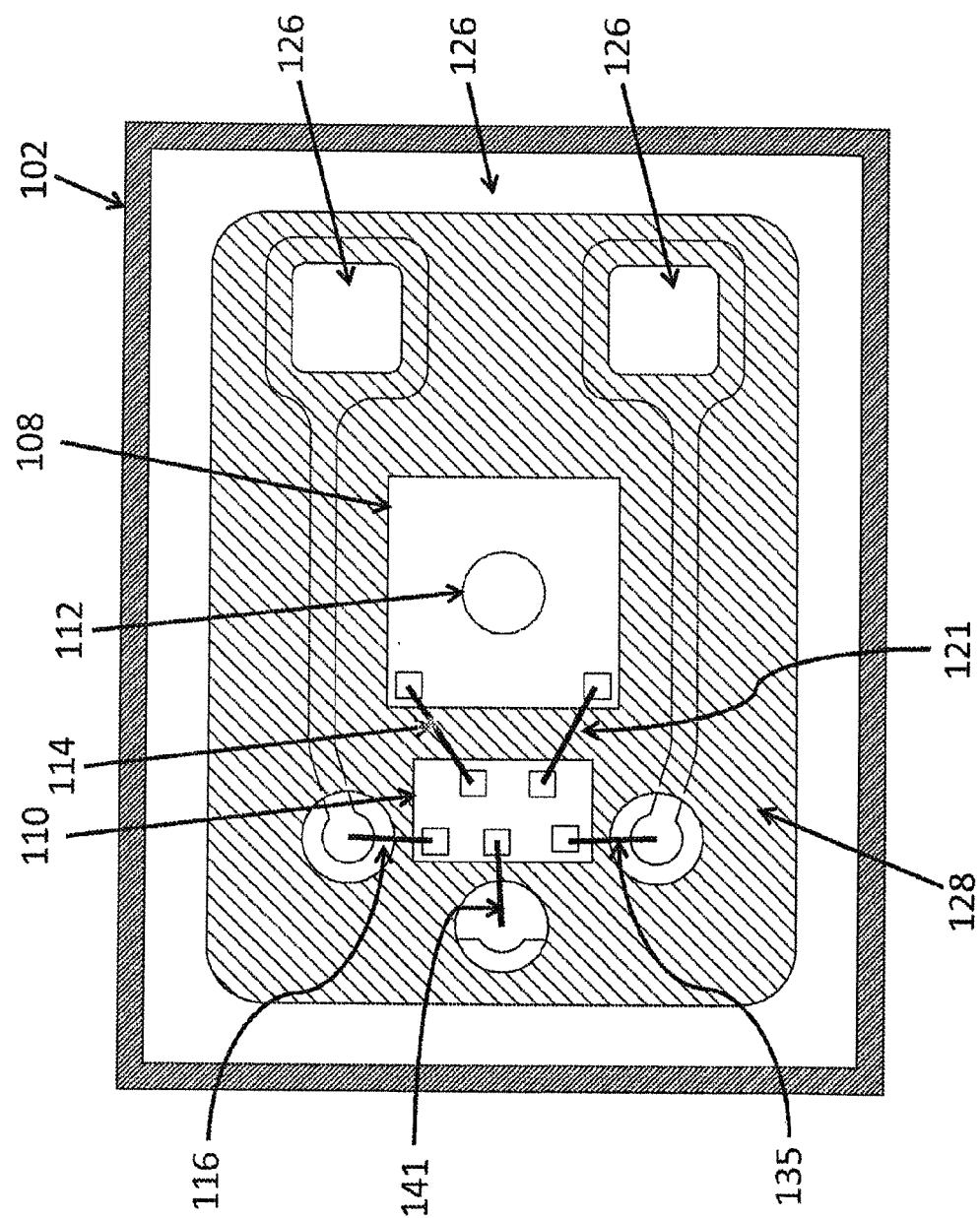
FIG. 4 comprises a bottom view of the lid of the microphone assembly of FIG. 1 according to various embodiments of the present invention.
Figure 5:
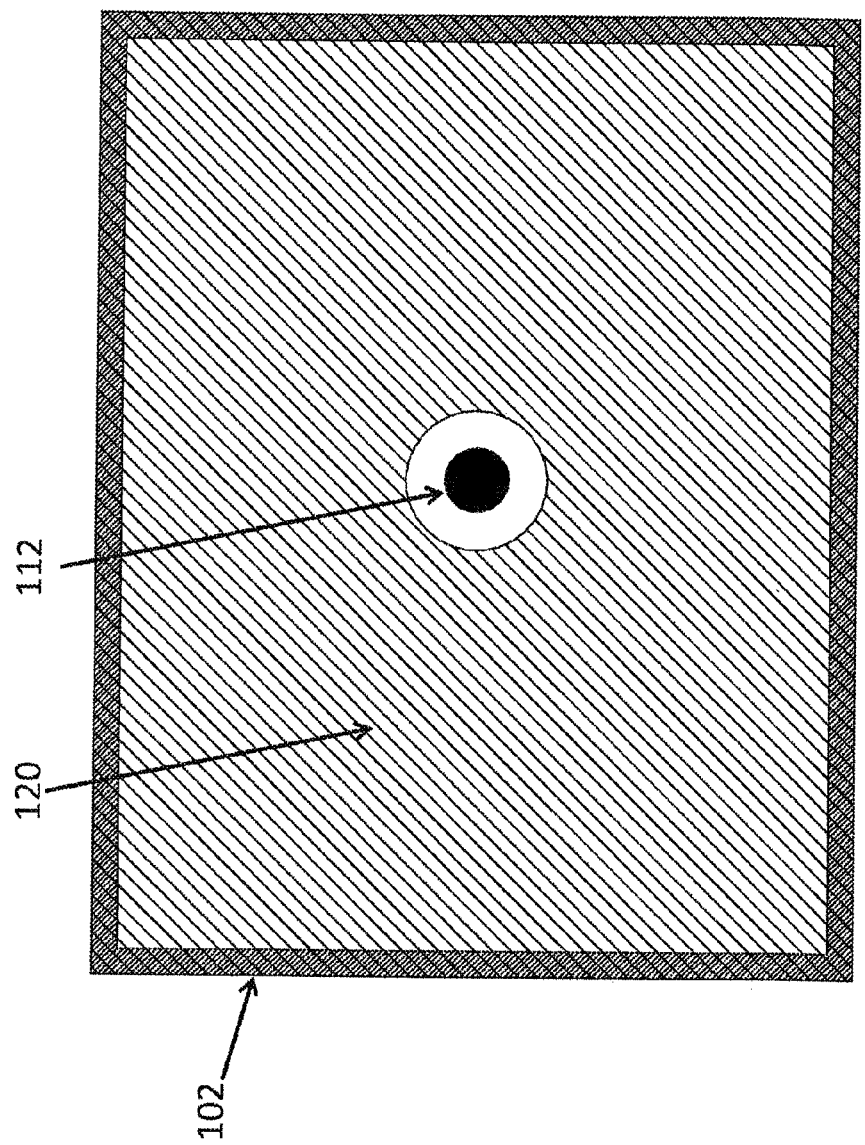
FIG. 5 comprises a top view of the lid of the microphone assembly of FIG. 1 according to various embodiments of the present invention.
Figure 6:
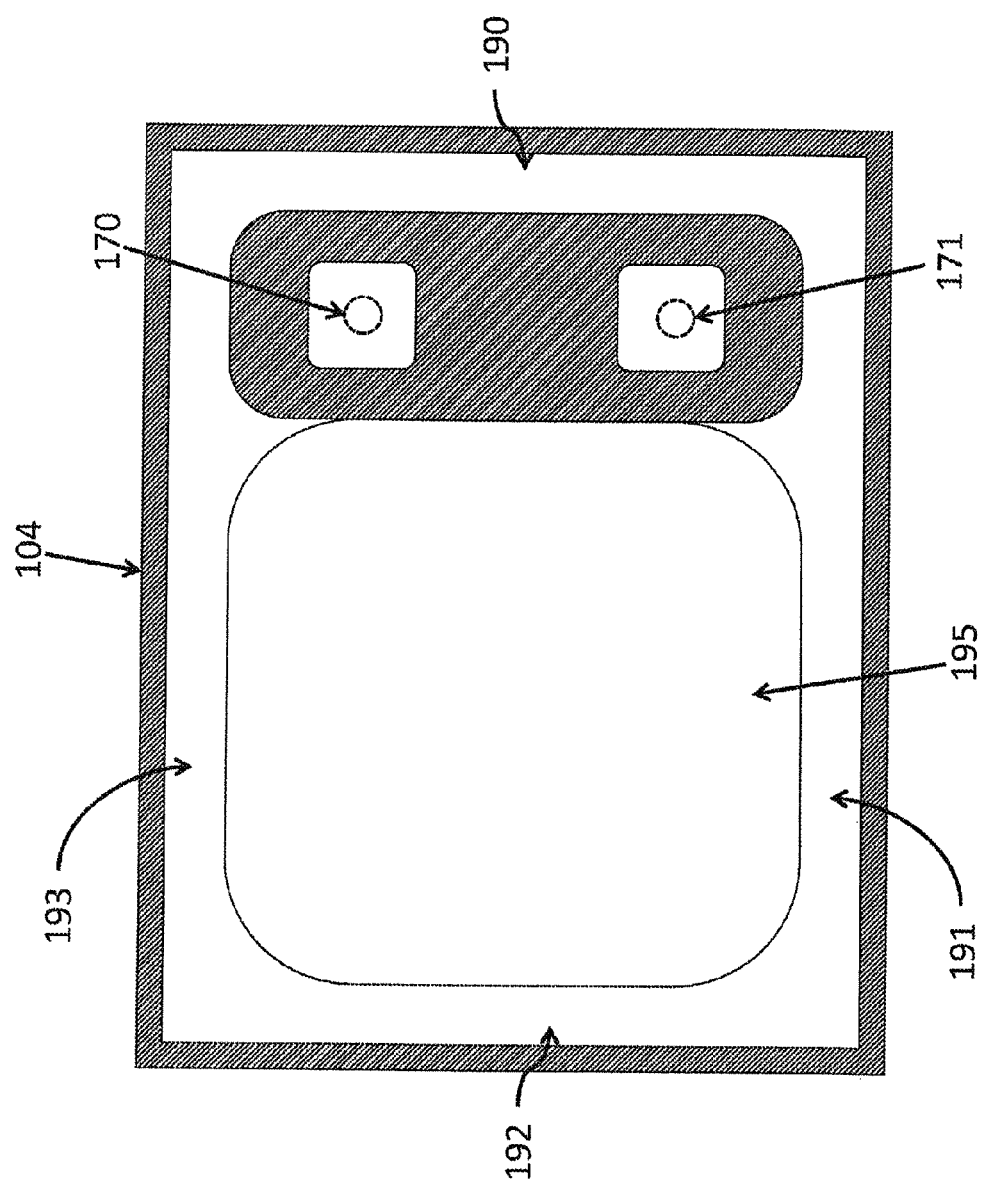
FIG. 6 comprises a top view of the wall portion of the microphone assembly of FIG. 1 according to various embodiments of the present invention.
Figure 7:
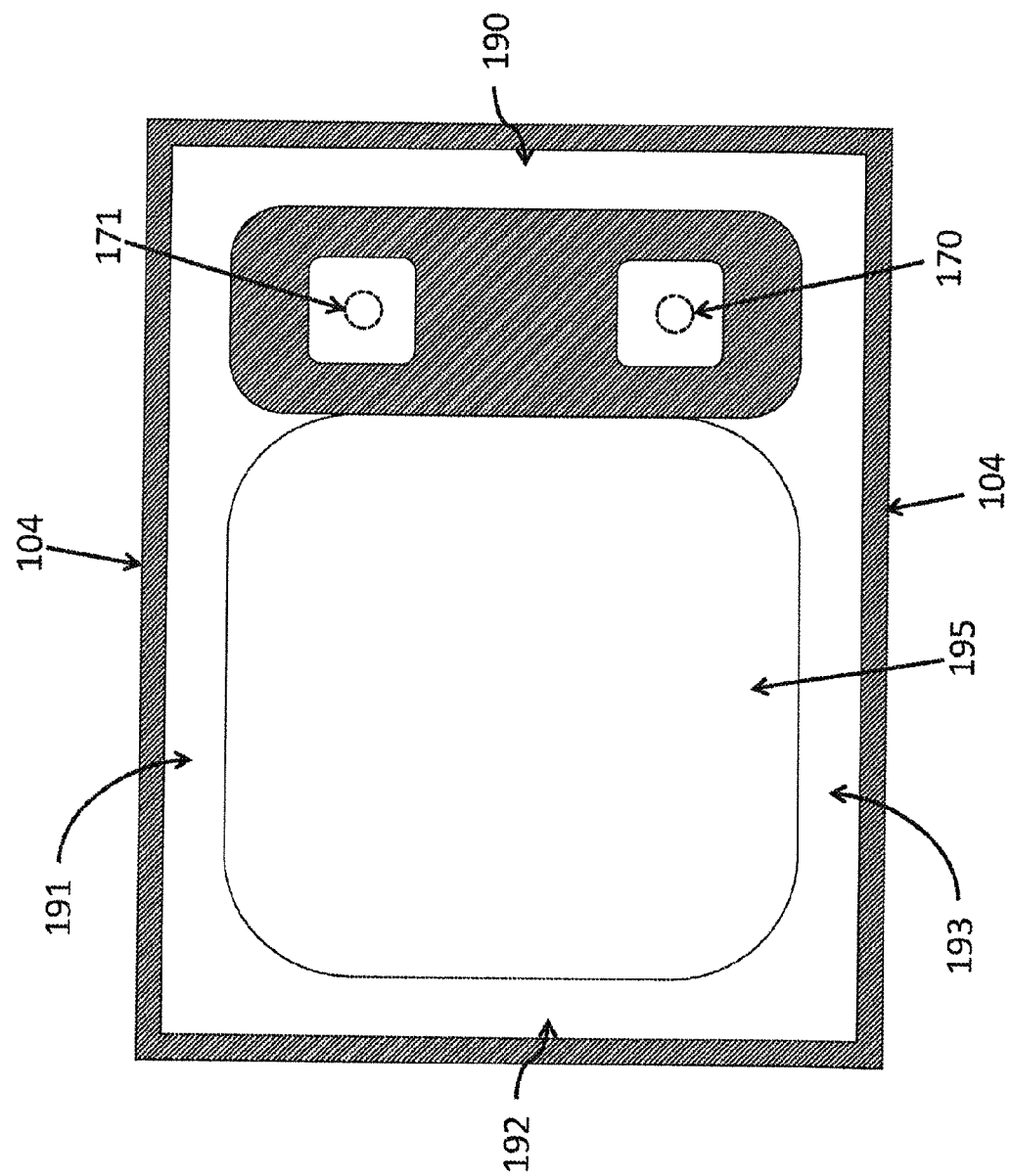
FIG. 7 comprises a bottom view of the wall portion of the microphone assembly of FIG. 1 according to various embodiments of the present invention.
Figure 8:
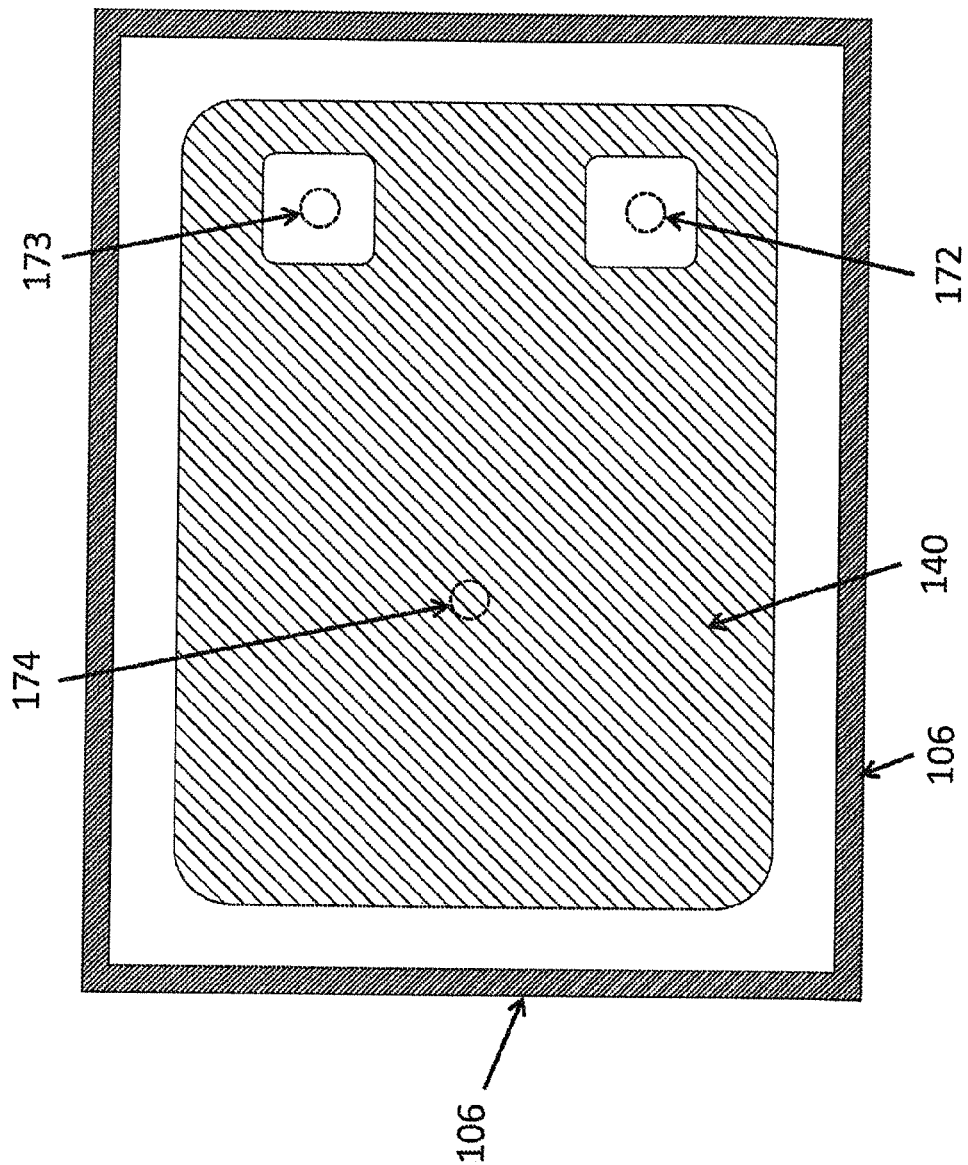
FIG. 8 comprises a top view of the base of the microphone assembly of FIG. 1 according to various embodiments of the present invention.
Figure 9:
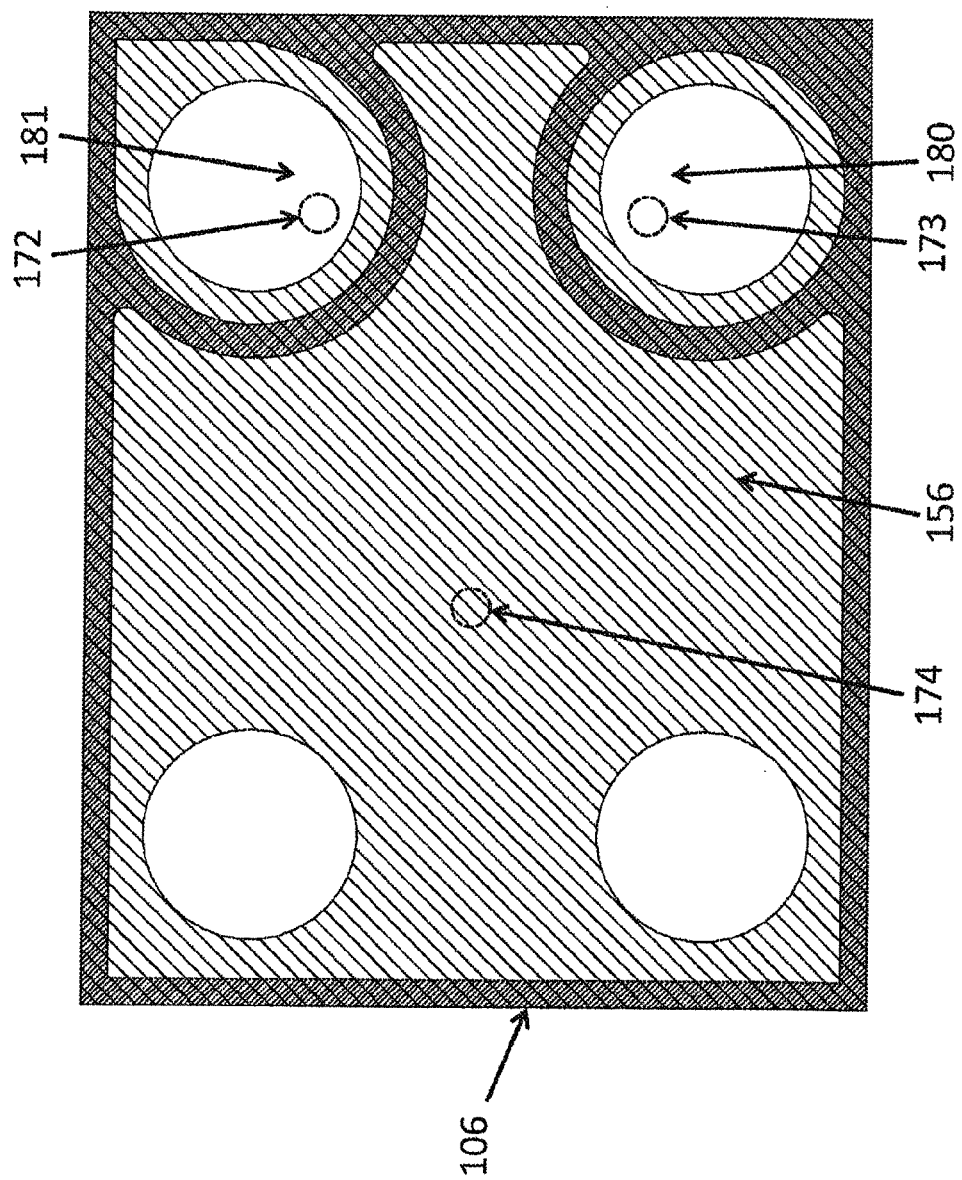
FIG. 9 comprises a bottom view of the base of the microphone assembly of FIG. 1 according to various embodiments of the present invention.

Referring now to FIGS. 1-9, one example of a microelectromechanical system (MEMS) component disposed at a lid of a microphone assembly 100 is described. The assembly 100 includes a lid 102, a wall 104 (with wall portions 190, 191, 192, and 193), a base 106, a MEMS apparatus or device 108, and an IC 110. A single piece of wall material has an opening drilled/punched therethrough. In other words, the wall portions 190, 191, 192, and 193 are preferably not individual segments that are fastened together, but are contiguous.

Generally speaking, each of the lid 102, wall 104, and base 106 are formed of multiple layers of materials. More specifically, the lid 102 includes an optional first solder mask layer 120, a first conductive layer 122, an insulator layer 124, a second conductive layer 126, and a second solder mask layer 128. The wall portion 104 includes a first conductive layer 130, an insulator layer 132, and a second conductive layer 134. The base 106 includes a first solder mask layer 140, a first conductive layer 142, a first insulator layer 144, a second conductive layer 146, a dielectric layer 148, a third conductive layer 150, a second insulator layer 152, a fourth conductive layer 154, and a second solder mask layer 156. A front volume 113 is formed at least in part in the port while a back volume 115 is formed in the interior of the assembly 100. It will be appreciated that the lid 102, wall 104, and the base 106 can be formed of any number of layers. For example, in one aspect the lid 102 and base 106 could be four layer PCBs containing embedded capacitance dielectric material. In another example, the lid 102 and the base 106 are two layer PCBs. In another example, the lid 102 can be a two layer PCB containing embedded active and passive electronic devices.

Generally speaking and in one perspective, each of the lid 102, the wall portion 104, and the base 106 are rectangular in shape. The wall 104 contains an open cavity 195 in the center of the wall portion 104. (the cavity in the wall is plated and acts as a ground via and when assembled with the lid and base forms a faraday cage protecting the MEMS device and IC and improves RF immunity) In other words, when assembled into the assembly 100, the lid 102, wall portion 104, and base 106 form a hollow structure 115 in which the components are located.

In one aspect, the lid 102 is generally flat and is separate from the wall 104. Both lid 102 and wall 104 are separate from the base 106. As described elsewhere herein, solder may attach corresponding vias 170 and 171 of the wall 104, to the conductive pads 126 of the lid 102, and the base 106. Additionally, other attachment approaches (e.g., conductive adhesive) may be used to attach these components together.

The MEMS apparatus 108 receives acoustic energy and transduces the acoustic energy into electrical energy. In that respect, the MEMS apparatus 108 may include a diaphragm and a back plate. The acoustic energy (e.g., changes in sound pressure) causes movement of the diaphragm with respect to the backplate which is transduced into an electrical signal. The resulting electrical signal that is produced represents the acoustic energy that has been received by the MEMS apparatus 108. The MEMS apparatus 108 is attached to the lid 102 by adhesive or any other appropriate fastening mechanism or approach.

The integrated circuit 110 is any kind of integrated circuit that performs any kind of processing function. In one example, the integrated circuit 110 is a buffer or an amplifier. Other examples of integrated circuits are possible. The integrated circuit 110 is attached to the lid 102 by adhesive or any other appropriate fastening mechanism or approach. In another example, the integrated circuit 110 can be embedded into the insulating layer of the lid 102. Although only one integrated circuit is shown in this example, it will be appreciated that multiple integrated circuits may be deployed. And, as used herein, "integrated circuit (IC)" refers to any type of processing circuitry performing any type of processing function.

Solder regions 160 physically connect the lid 102 to the wall portion 104 and the wall portion 104 to the base 106. These regions 160 also provide an electrical contact between conductive areas of the lid 102 (and the base 106) and the wall portion 104.

An acoustic port or opening 112 is formed through the lid 102. The MEMS apparatus 108 is disposed over the port 112. Acoustic energy is received by the MEMS apparatus 108 through the port 112. In other aspects, the MEMS apparatus 108 may be disposed partially over or near the port 112. The MEMS device 108 is coupled by one or multiple wires 114 to the IC 110. The integrated circuit 110 is coupled to the second conductive layer 126 of the lid 102 via one or multiple wires 116.

First and second vias 170 and 171 are hollow (or filled) cavities that extend through the wall 104 and are conductive. Third and forth vias 172 and 173 extend through the base 106 and are also conductive. Vias 172 and 173 are designed so as to ultimately connect to vias 170 and 171. The vias 172 and 173 are electrically connected to conductive pads or connections 180 and 181 where a customer can make electrical connections. The fifth via 174 extends through base 106 and in this case provide a grounding connection for the MEMS device 108 and the integrated circuit 110. In some aspects and to facilitate their conductive function, the vias 170, 171, 172, and 173 are plated with a conductive material (e.g., copper) so that electrical signals can be conducted by and through the vias. Alternatively, the vias 170, 171, 172, and 173 may be completely or partially filled with a conductive or insulating material.

It will be understood that the vias provide electrical connections for various types of electrical signals. For example and referring especially to FIGS. 2 and 3, an electrical connection exists from the wire 116, a conductive path on the second conductive layer 126, to the via 171 (solder 160, and in some cases a polymeric seal 175 is used), to the first conductive area 142 of the base 106 (solder 160, and in some cases a polymeric seal 175 is used), the via 172, and then to the outside pad 180 thereby providing a signal path 133 for the processed signal of the integrated circuit 110 to reach and be accessible to a customer. In another aspect, the wire 135, a conductive path on the second conductive layer 126, via 170, via 173 to the outside pad 181 provides a path for a Vdd source power voltage to the integrated circuit 110. In yet another aspect, the wire 141, a conductive path on the second conductive layer 126, the wall 104, and via 174 provides a ground path 143 from the integrated circuit 110 and the MEMS device 108 and electrical ground.

The various conductive layers are constructed of a conductive material such as a metal. The various insulator layers are constructed of an electrically insulator material such as an epoxy glass laminate. The various solder mask layers are constructed of a material such as photopolymer. The layers may be formed and fabricated according to any known construction approach or technology.

In one example of the operation of the assembly of FIGS. 1-9, sound or acoustic energy enters through the port 112. The MEMS apparatus 108 includes a diaphragm and a back plate. The acoustic energy (e.g., changes in sound pressure) causes movement of the diaphragm with respect to the backplate which is transduced into an electrical signal. The resulting electrical signal that is produced represents the sound energy that has been received by the MEMS apparatus 108. This electrical signal is transmitted to the integrated circuit 110 via the wire 114. A wire 121 may transmit power from the integrated circuit 110 to or provide a ground connection to the MEMS device 108. The integrated circuit 110 processes the signal. The processed signal is transmitted from the integrated circuit 110 over the wire 116. The wire 116 is connected to the conductive layer 126 of the lid 102. The signal is transmitted by this conductor to a via 171. The signal is then transmitted through a via 171 and to the third conductive layer 150 of the base 106. The third conductive layer of the base is electrically coupled to connection pad 180 on the base. From the connection pad 180, a customer can make an appropriate electrical connection and receive the signal.

It will be appreciated that the front volume 113 is reduced compared to previous top port devices while the back volume 115 is increased. This has the beneficial result of shifting the resonant peak by as much as 10 kHz, of the microphone assembly to higher frequencies and increasing overall sensitivity of the MEMS device, respectively. This allows for a top microphone that generates a flat response in the ultrasonic range that can be implemented in applications requiring wide band performance. Additionally, the assembly method of the lid, wall and base is manufacturable at high volumes.

Figure 10:
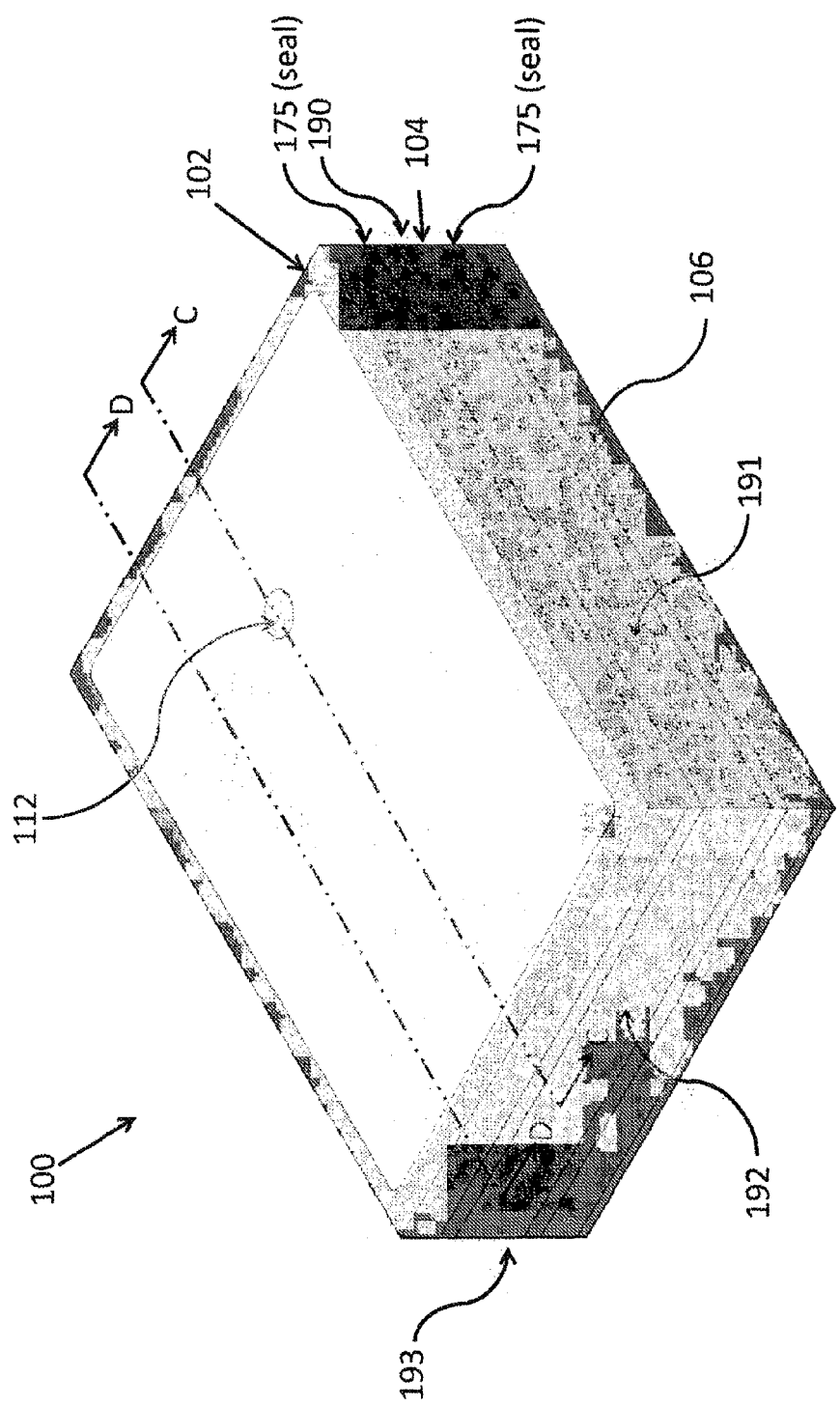
FIG. 10 comprises an isometric view of another microphone assembly according to various embodiments of the present invention.
Figure 11:
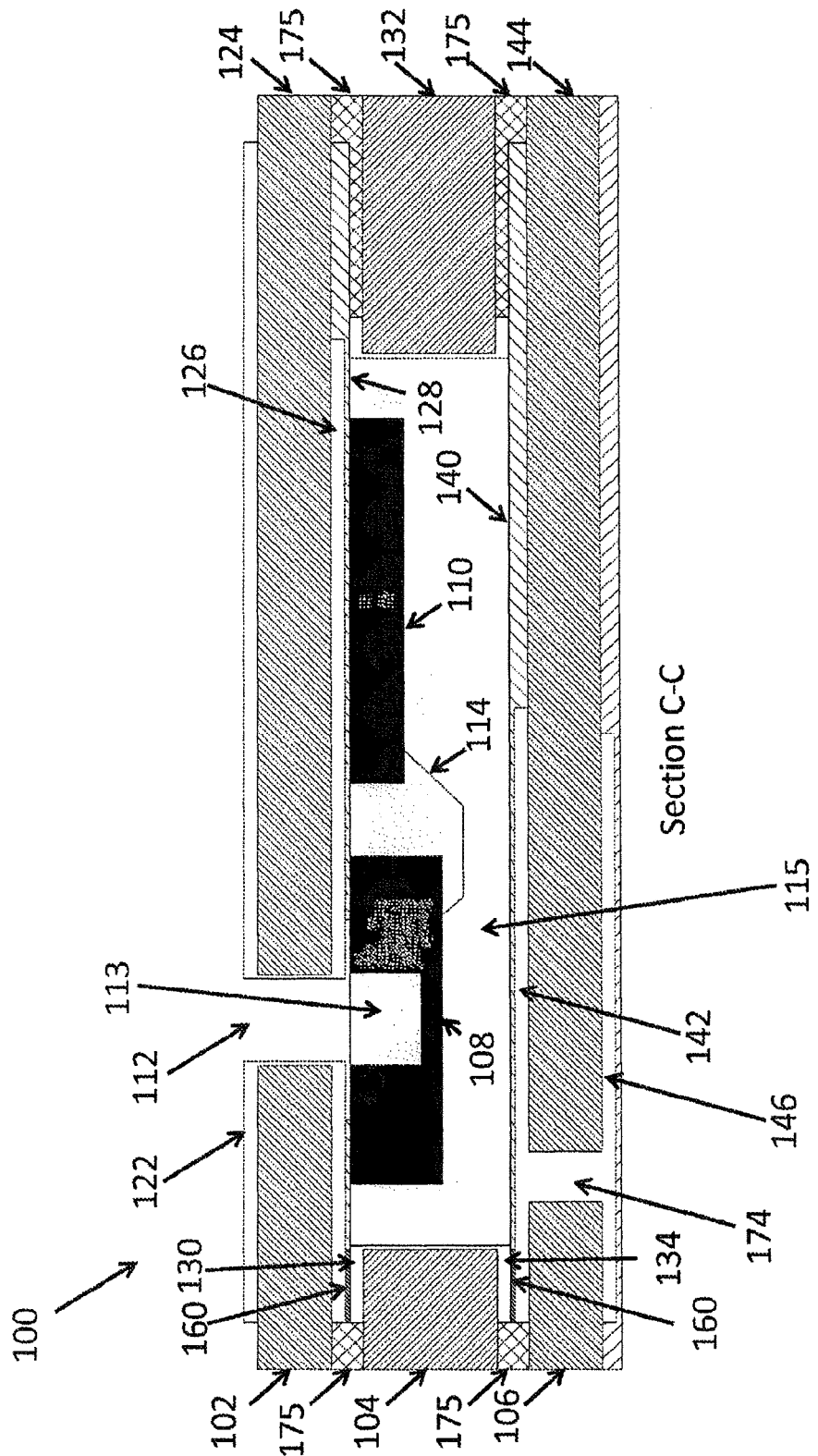
FIG. 11 comprises a cross-sectional view taken along lines C-C of the microphone assembly of FIG. 10 according to various embodiments of the present invention.
Figure 12:
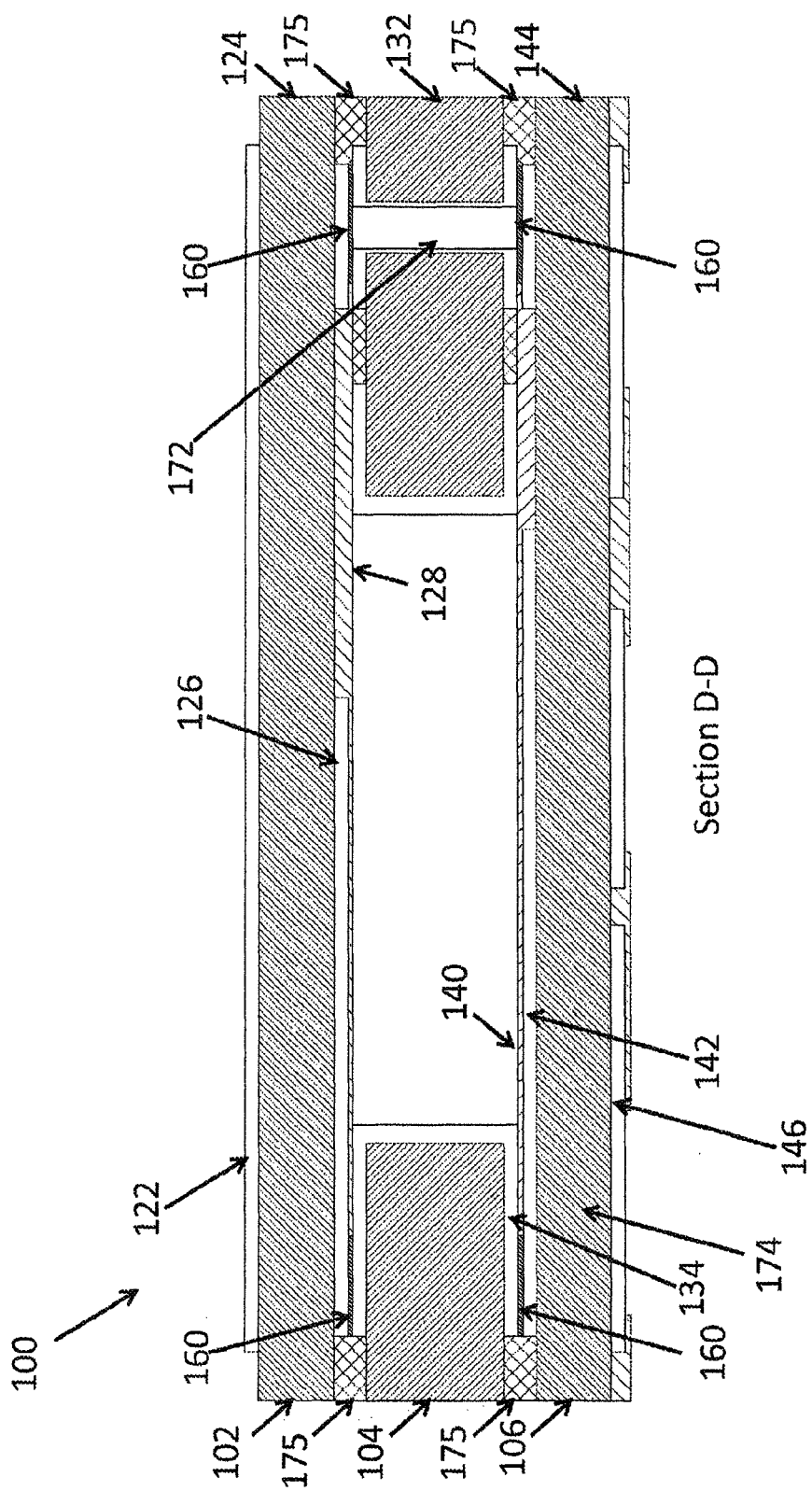
FIG. 12 comprises a cross-sectional view taken along lines D-D of the microphone assembly of FIG. 10 according to various embodiments of the present invention.
Figure 13:
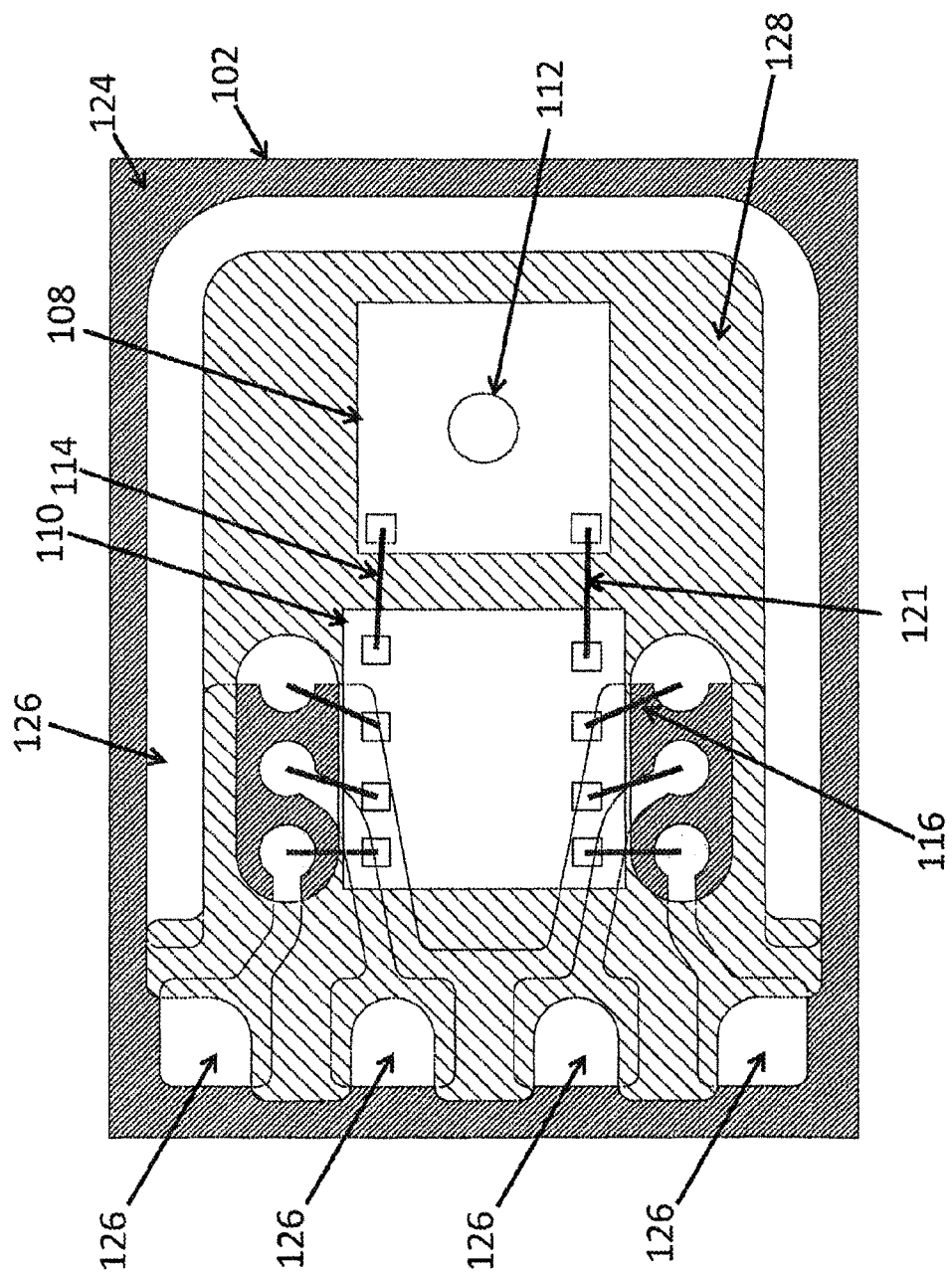
FIG. 13 comprises a bottom view of another example of a layout for a lid of the microphone assembly of FIG. 10 according to various embodiments of the present invention.
Figure 14:
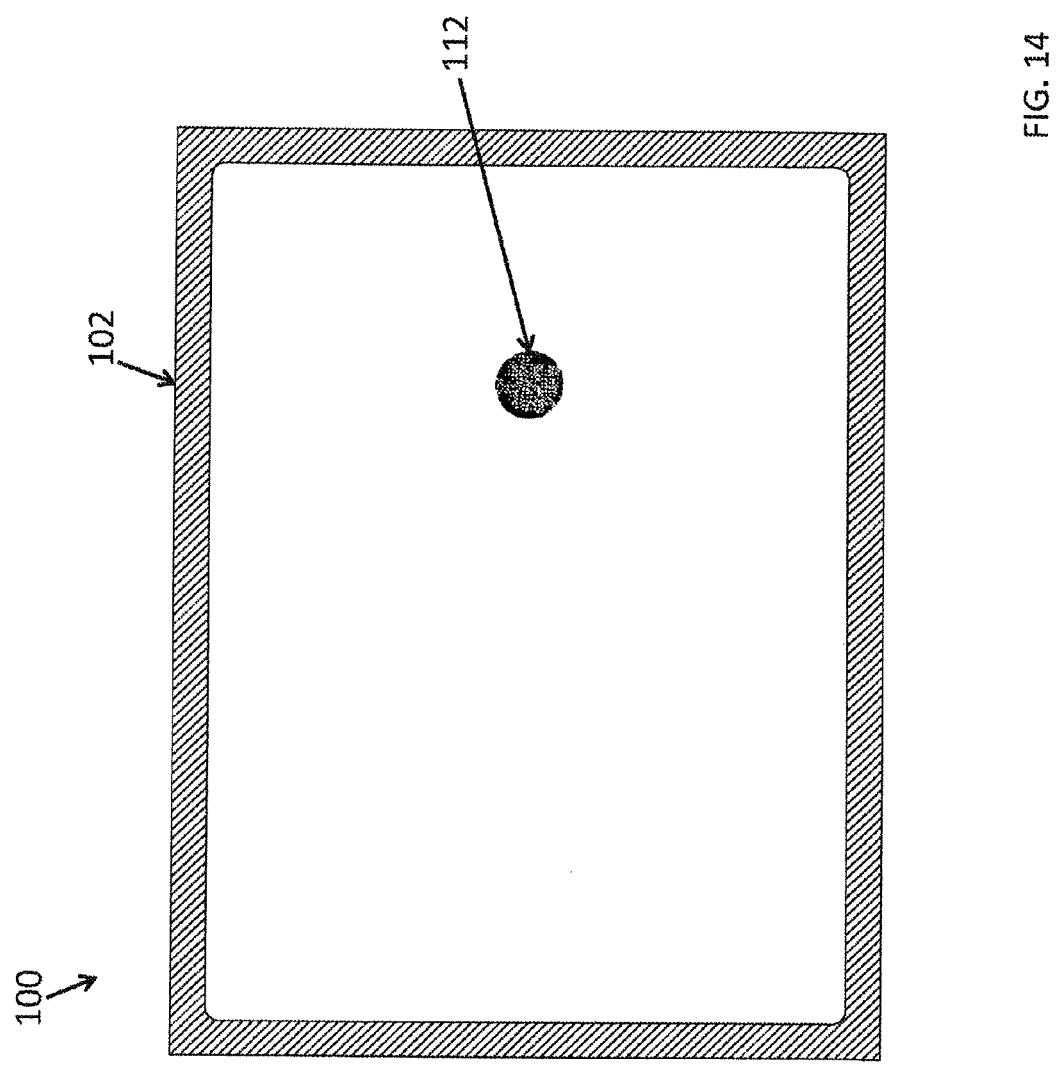
FIG. 14 comprises a top view of the lid of the assembly of FIG. 10 according to various embodiments of the present invention.
Figure 15:
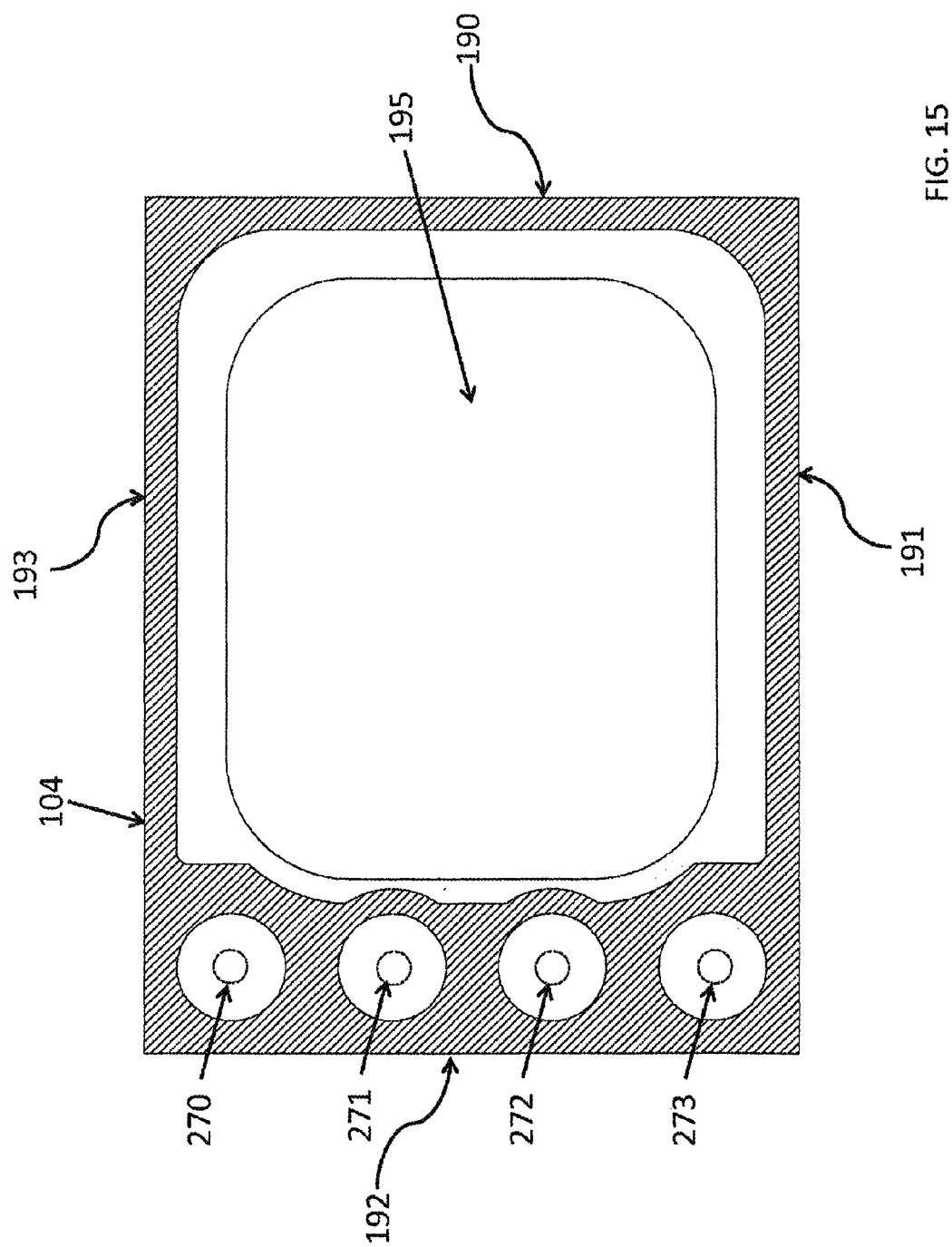
FIG. 15 comprises a top view of the wall portion that would attach to the lid bottom of the assembly of FIG. 10 according to various embodiments of the present invention.
Figure 16:
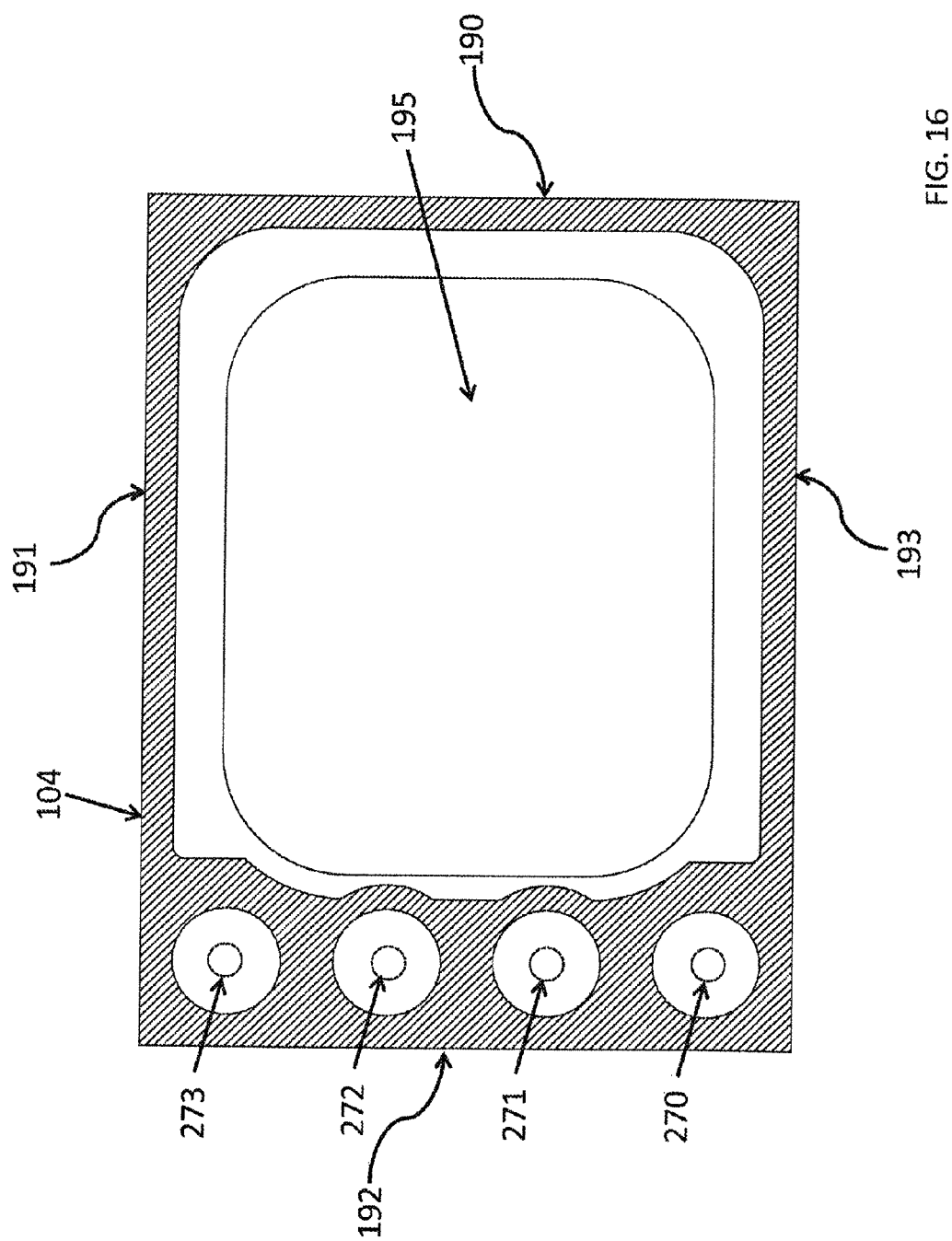
FIG. 16 comprises a bottom view of the wall portion of the microphone assembly of FIG. 10 according to various embodiments of the present invention.
Figure 17:
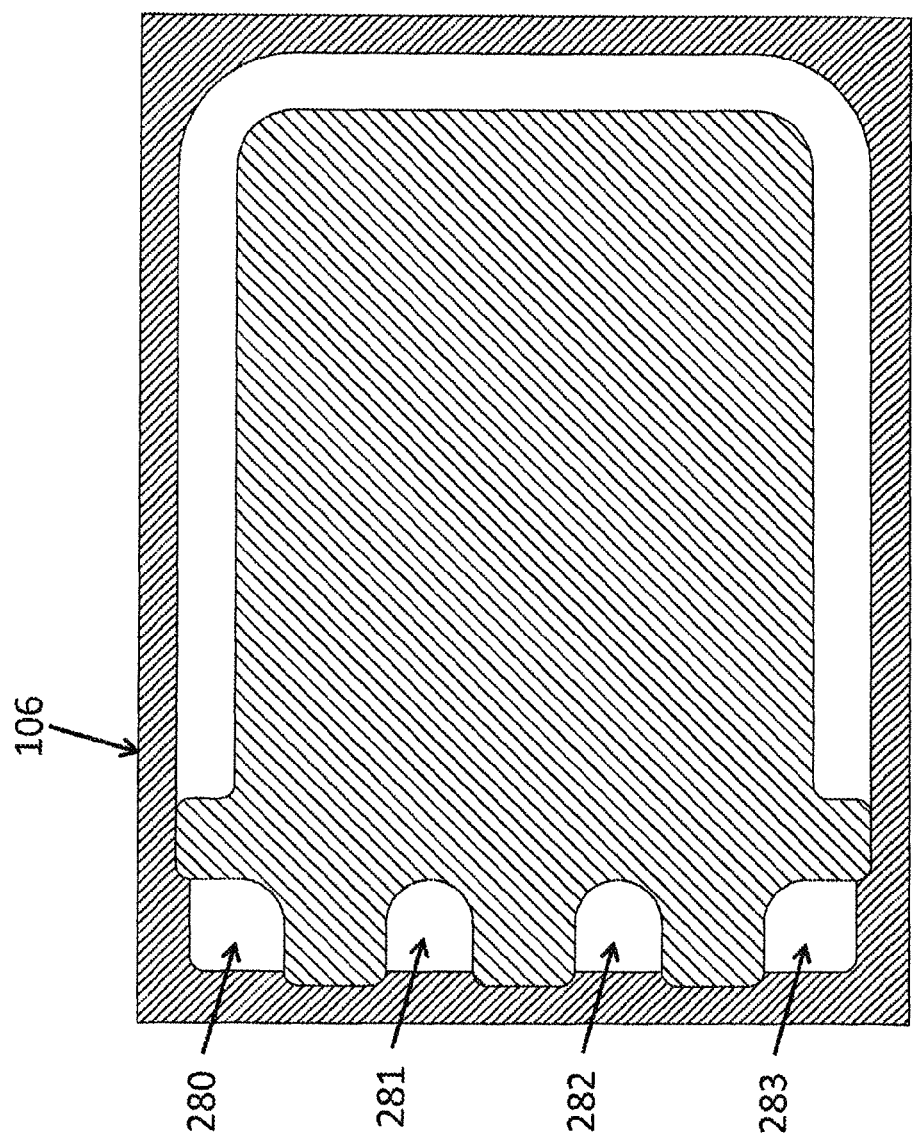
FIG. 17 comprises a top view of the base that would assemble to the bottom of the wall of the assembly of FIG. 10 according to various embodiments of the present invention.

It will be appreciated that the disposition of the MEMS device 108 and the integrated circuit 110 on the lid, the layout and dimensions of the conductive paths on the lid, the size, shape, and disposition of the vias can vary according to the needs of the user or system. Referring now to FIGS. 10-18, one example of an assembly with an alternate layout for the lid is described. Similar elements to those shown in FIGS. 1-9 are included in FIGS. 10-18, and these descriptions will not be repeated here. The same elements are numbered using the same numerals.

In this example, the conductive paths extend from the integrated circuit to a single wall portion 192. Corresponding vias 270, 271, 272, and 273 are formed in a single wall portion and couple to corresponding pads 280, 281, 282, and 283 in the base 106. These pads 280, 281, 282, and 283 route to pads 290, 291, 292, 293, 294, and 295 using vias in the base 106 where electrical contact may be made by a customer. The operation of this example is the same as that given above with respect to the example in FIGS. 1-9 and only the placement of vias and conductive paths is different. It will be also understood that other examples and configurations for electrical layouts are possible.

It will be appreciated that in many of the embodiments described herein, electrical connections are made through vias in the walls of the assembly rather through free-hanging and separate wires. In so doing, the electrical connections are more rigid and less susceptible to noise induced by mechanical vibration. Additionally, by making the electrical connections through vias in the wall, cumbersome wire bonding connections in confined and tight spaces can be avoided resulting in a device that can more easily be manufactured. The present approach establishes electrical connections such that the MEMS devices can be mounted in a preferred orientation that enhances its electrical-mechanical response to acoustic energy without significant alterations to the external interface location with respect to the acoustic port.

Preferred embodiments of this invention are described herein, including the best mode known to the inventors for carrying out the invention. It should be understood that the illustrated embodiments are exemplary only, and should not be taken as limiting the scope of the invention.

What is claimed is:
1. A Microelectromechanical system (MEMS) assembly comprising,
a base substrate having a first base via extending through the base substrate, wherein the first base via is electrically connected to a first electrical connection pad on the base substrate, wherein the first base via is hollow and has an interior surface that is plated with a first base conductive material and filled with a first base insulating material;
a lid;
a MEMS device attached to the lid and mounted over an acoustic port;
a wall coupled to the lid and the base substrate, wherein the wall includes a first wall portion and a second wall portion opposing each other, and a third wall portion and a fourth wall portion opposing each other, wherein the first, second, third, and fourth wall portions form a cavity within which the MEMS device is disposed;
a first wall via disposed within only the first wall portion of the wall and not through the second wall portion, the third wall portion, or the fourth wall portion, wherein the first wall via is hollow and has an interior surface that is plated with a first wall conductive material and filled with a first wall insulating material, wherein the first wall via is electrically coupled to the first base via.

2. The MEMS assembly of claim 1, further comprising an integrated circuit attached to the lid and electrically connected to the MEMS device.

3. The MEMS assembly of claim 1, wherein at least one of the lid and the base substrate contains multiple layers.

4. The MEMS assembly of claim 1, further comprising:
a second base via within the base substrate, wherein the second base via is electrically connected to a second electrical connection pad on the base substrate, wherein the second base via is hollow and has an interior surface that is plated with a second base conductive material and filled with a second base insulating material;
a second wall via disposed within only the first wall portion of the wall and has an interior surface that is plated with a second wall conductive material and filled with a second wall insulating material, wherein the second wall via is electrically connected to the second base via,
a second electrical connector that connects the second wall via to the second base via and provides a ground.

5. The MEMS assembly of claim 4, wherein the first wall via is substantially aligned with the second wall via.

6. The MEMS assembly of claim 5, wherein a signal processed by the integrated circuit reaches a first electrical connection pad of the base substrate through a first electrical path formed on the lid, the first base via and the first wall via, and the electrical connector.

7. The MEMS assembly of claim 6, wherein a source power voltage is provided to the integrated circuit through a second electrical connection pad of the base substrate, the second base via, the second wall via, the second electrical connection, and a second electrical path formed on the lid.

8. The MEMS assembly of claim 7, wherein the first, second, third, and fourth wall portions are plated and act as a ground.

9. The MEMS assembly of claim 8, wherein the ground is provided to the integrated circuit through the second wall portion and a third electrical path formed on the lid.

10. A surface-mount Microelectromechanical system (MEMS) assembly comprising,
a base substrate having an electrical conductor extending through the base substrate between a first surface of the base substrate and a second surface of the base substrate opposite the first surface;
a surface mount pad disposed on the first surface of the base substrate coupled to the electrical conductor extending through the base substrate;
a cover having an acoustic port extending through the cover;
an acoustic MEMS sensor fastened to the cover over the acoustic port;
a wall disposed between the cover and the second surface of the base substrate wherein the cover, the wall, and the base substrate form a cavity within which the acoustic MEMS sensor is disposed, and wherein at least the wall and the cover are discrete elements,
an electrically conductive via extending through a wall portion between the cover and the base substrate, the wall portion through which the electrically conductive via extends has a width greater than a width of wall portions devoid of the electrically conductive via,
the electrically conductive via electrically coupled to the electrical conductor of the base substrate and to an electrical conductor at the cover; and
the electrically conductive via having a hollow portion plated with a conductive material, an insulating material disposed in the hollow portion of the electrically conductive via.

11. The MEMS assembly of claim 10, the wall comprises multiple sides formed as a unitary member, the wall portion through which the electrically conductive via extends is a single side of the wall, the single side of the wall through which the electrically conductive via extends having a width greater than a width of the sides of the wall devoid of the electrically conductive via.

12. The MEMS assembly of claim 11,
the base substrate having multiple electrical conductors extending through the base substrate between the first surface and the second surface of the base substrate,
multiple electrically conductive vias extending through the wall portion between the cover and the base substrate, the wall portion through which the multiple electrically conductive vias extend having a width greater than a width of wall portions devoid of the multiple electrically conductive vias,
each electrically conductive via electrically coupled to a corresponding electrical conductor of the base substrate and to a corresponding electrical conductor at the cover; and
each of the electrically conductive vias is hollow, an insulating material disposed in each hollow electrically conductive via.

13. The MEMS assembly of claim 12 further comprising an integrated circuit disposed within the cavity and electrically coupled to the acoustic MEMS sensor, a first electrically conductive via electrically coupled to a power pin of the integrated circuit by a corresponding electrical conductor at the cover, a second electrically conductive via electrically coupled to a ground pin of the integrated circuit by a corresponding electrical conductor at the cover, and a third electrically conductive via electrically coupled to a signal output pin of the integrated circuit by a corresponding electrical conductor at the cover.

14. The MEMS assembly of claim 10, the electrically conductive via comprises conductive plating formed on a surface of a passage through the wall portion.

15. The MEMS assembly of claim 10 further comprising an integrated circuit disposed within the cavity and electrically coupled to the acoustic MEMS sensor, the electrically conductive via electrically coupled to the integrated circuit by the electrical conductor at the cover.

16. The MEMS assembly of claim 10, the cover, the wall and the base substrate each comprise multiple layers, wherein the cover, the wall and the base substrate each have a conductive layer that forms a substantially electrically and magnetically shielded cavity.

17. A Microelectromechanical system (MEMS) assembly comprising,
- a base substrate having an electrical conductor extending through the base substrate between a first surface of the base substrate and a second surface of the base substrate opposite the first surface;
- a surface mount pad disposed on the first surface of the base substrate coupled to the electrical conductor extending through the base substrate;
- a cover;
- an acoustic MEMS sensor;
- a wall disposed between the cover and the second surface of the base substrate wherein the cover, the wall, and the base substrate form a cavity within which the acoustic MEMS sensor is disposed, and wherein at least the wall and the cover are discrete elements,
- an electrically conductive via extending through a wall portion between the cover and the base substrate, the wall portion through which the electrically conductive via extends has a width greater than a width of wall portions devoid of the electrically conductive via,
- the electrically conductive via electrically coupled to the electrical conductor of the base substrate and to an electrical conductor at the cover; and
- the electrically conductive via having a hollow portion plated with a conductive material, an insulating material disposed in the hollow portion of the electrically conductive via.

* * * * *